United States Patent
Blasco Claret et al.

(10) Patent No.: US 9,543,985 B2
(45) Date of Patent: Jan. 10, 2017

(54) METHOD OF CODIFYING DATA INCLUDING GENERATION OF A QUASI-CYCLIC CODE

(71) Applicant: Marvell Hispania, S.L., Madrid (ES)

(72) Inventors: Jorge Vicente Blasco Claret, Valencia (ES); Salvador Iranzo Molinero, Betera (ES); Agustin Badenes Corella, Valencia (ES)

(73) Assignee: Marvell Hispania, S.L., Madrid (ES)

( * ) Notice: Subject to any disclaimer, the term of this patent is extended or adjusted under 35 U.S.C. 154(b) by 0 days.

(21) Appl. No.: 14/988,177

(22) Filed: Jan. 5, 2016

(65) Prior Publication Data

US 2016/0119000 A1    Apr. 28, 2016

Related U.S. Application Data

(63) Continuation of application No. 14/270,637, filed on May 6, 2014, now Pat. No. 9,240,806, which is a
(Continued)

(30) Foreign Application Priority Data

Feb. 6, 2009    (ES) .................................. 200900343
Jan. 20, 2010    (ES) .................................. 201030066

(51) Int. Cl.
*H03M 13/00* (2006.01)
*H03M 13/11* (2006.01)
*H04L 1/00* (2006.01)

(52) U.S. Cl.
CPC ......... *H03M 13/116* (2013.01); *H03M 13/005* (2013.01); *H03M 13/118* (2013.01); *H03M 13/1188* (2013.01); *H03M 13/616* (2013.01); *H03M 13/6362* (2013.01); *H03M 13/6527* (2013.01); *H03M 13/6544* (2013.01); *H04L 1/0045* (2013.01)

(58) Field of Classification Search
None
See application file for complete search history.

(56) References Cited

U.S. PATENT DOCUMENTS 7,203,897 B2    4/2007    Blankenship et al.
7,260,763 B2    8/2007    Sukhobok et al.
(Continued)

FOREIGN PATENT DOCUMENTS

EP         1511177 A2        3/2005
WO    WO-2007/088440 A2    8/2007

OTHER PUBLICATIONS

Richardson, Thomas J., et al; "Efficient Encoding of Low-Density Parity-Check Codes"; IEEE Transactions on Information Theory; IEEE, US, vol. 47, No. 2; Feb. 1, 2001; XP011027880, ISSN: 0018-9448; p. 641-p. 642.
(Continued)

*Primary Examiner* — Daniel McMahon

(57) ABSTRACT

A method including selecting a factor based on a number of bits in a codeword and a natural number and generating a model matrix including first and second matrices having data and parity bits. Hamming weights of the model matrix are not constant and Hamming weights of columns of the model matrix follow a statistical distribution dependent upon a codification rate of a channel. A compact matrix is generated by replacing elements of the model matrix equal to: 1 with a pseudo-random positive whole number; and 0 with −1. A quasi-cyclic code is generated by replacing in the compact matrix: positive elements with identity matrices; and elements equal to −1 with null matrices. A number of rows and columns in each of the identity and null matrices is equal to the factor. The quasi-cyclic code is applied to a word to generate a codeword, which is transmitted on the channel.

27 Claims, 4 Drawing Sheets

Related U.S. Application Data continuation of application No. 13/056,343, filed as application No. PCT/ES2010/070067 on Feb. 5, 2010, now Pat. No. 8,719,655.

(56) References Cited

U.S. PATENT DOCUMENTS

| | | | |
|---|---|---|---|
| 7,343,548 | B2 | 3/2008 | Blankenship et al. |
| 8,719,655 | B2 | 5/2014 | Blasco Claret et al. |
| 2006/0129904 | A1 | 6/2006 | Blankenship et al. |
| 2008/0222486 | A1 | 9/2008 | Richardson et al. |
| 2010/0287440 | A1 | 11/2010 | Alrod et al. |
| 2012/0221914 | A1 | 8/2012 | Morero et al. |
| 2013/0061117 | A1 | 3/2013 | Gioulekas et al. |
| 2014/0304569 | A1 | 10/2014 | Blasco Claret et al. |

OTHER PUBLICATIONS

Kim, J., et al; "Quasi-Cyclic LDPC Codes for Fast Encoding"; IEEE Transactions on Information Theory; IEEE, US, LNKD-DPI:10.1109/TIT.2005.851753; vol. 51, No. 8; Aug. 1, 2005; pp. 2894-2901; XP011136337, ISSN: 0018-9448; p. 2898-p. 2899.

Classon, B., et al; "LDPC Coding for OFDM, PHY", Internation Citation; Aug. 17, 2004; XP002371218, Retrieved from the Internet: URE:http://ieee802.org/16> [retrieved on Mar. 9, 2006].

Gallagher, Robert G.; "Low Density Parity Check Codes", M.I.T. Press, Cambridge, Massachusetts 1963.

Yige Wang et al.; "Construction of High-Girth QC-LDPC Codes"; Mitsubishi Electric Research Laboratories; Dept. of ECE, University of Wisconsin; Sep. 2008; 6 pages.

IEEE Std. 802.16-2009; Part 16: Air Interface for Broadband Wireless Access Systems; pp. 1057, 1058 and 1967-1969.

IEEE 802.16e-2005 and IEEE Std 802.16-2004/Cor1-2005 (Amendment and Corrigendum to IEEE Std 802.16-2004); IEEE Standard for Local and metropolitan area networks; Part 16: Air Interface for Fixed and Mobile Broadband Wireless Access Systems; Amendment 2: Physical and Medium Access Control Layers for Combined Fixed and Mobile Operation in Licensed Bands and Corrigendum 1; IEEE Computer Society and the IEEE Microwave Theory and Techniques Society; Sponsored by the LAN/MAN Standards Committee; Feb. 28, 2006; 864 pages.

Syed Aon Mujtaba; Agere Systems Inc.; IEEE 802.11-04/0889r6; IEEE P802.11 Wireless LANs; TGn Sync Proposal Technical Specification; May 18, 2005; 134 pages.

Summons to Attend Oral Proceedings for related European Application No. 10 710 590.0 mailed Nov. 13, 2014; 8 pages.

METHOD OF CODIFYING DATA INCLUDING GENERATION OF A QUASI-CYCLIC CODE

CROSS-REFERENCE TO RELATED APPLICATIONS

The present disclosure is a continuation of U.S. patent application Ser. No. 14/270,637, filed May 6, 2014 which is a continuation of U.S. patent application Ser. No. 13/056, 343, filed on Nov. 29, 2011 (now U.S. Pat. No. 8,719,655), which is a National Stage of International Application No. PCT/ES2010/070067, filed Feb. 5, 2010 which claims the benefit of Spanish Application No. P200900343, filed Feb. 6, 2009 and Spanish Application No. P201030066, filed Jan. 20, 2010. The disclosures of the above applications are incorporated herein by reference in their entirety.

FIELD

The invention presented here relates to data transmission, and more specifically, to the communication of data across noisy media, that is, communication media or channels that may introduce errors in the communication.

BACKGROUND

In communication environments it is common for a communication medium or external signals to introduce signal errors. Said errors must be detected and, if possible, corrected in reception so that correct data may be recovered. Several techniques exist for error detection and correction in the state of the art, including the codification and decodification of data based on low density parity check codes for correcting errors.

Low density parity check codes (LDPC) are error correction codes that are used in transmitting over noisy transmission channels. These codes introduce a certain redundancy in a message (a larger number of bits is sent than in the original message), but in such a way that at reception it is possible to detect whether there are errors in the message received and to correct the errors.

An LDPC code is a code whose parity matrix is not very dense, that is to say that the majority of its elements are zeros. This type of code was published for the first time at the beginning of the 1960s, by Robert G. Gallagher "Low Density Parity Check Codes," M.I.T. Press, 1963, and was shown to have features very close to the known Shannon limit (theoretical maximum rate for data transmission). However, with the original definition of the codes and the technology of that time, an attainable implementation of adequate complexity was not possible. Recently, thanks to the evolution of integrated circuits and the invention of structured matrices, these codes are once again of great interest.

In the state of the art there are multiple methods for achieving codification and decodification of errors. Some methods are those published in U.S. Pat. Nos. 7,343,548B2 and 7,203,897B2, both entitled "Method and Apparatus for Encoding and Decoding Data," each of which outlines methods for improving protection when confronted with errors in data transmission. The invention can also be related to standards IEEE802.16e and 802.11n, which present codification and decodification for reducing errors. In any case, the patents and standards mentioned use the double diagonal structure, which is known in the state of the art, while the structure presented in this document is new and allows an implementation with better features without increasing the level of complexity (thus at lower cost) of protection against errors in communicating data over noisy media. It is known in the state of the art that having columns with a Hamming weight equal to or less than 2 in the parity matrix restricts the features of the LDPCs. However, for reasons of complexity of implementation of the codifier, matrices with a double diagonal section $H_{b1}$ have been used in the state of the art. The new structure presented in this document, which adds a third diagonal to the section $H_{b1}$ of the binary model matrix, allows the total number of columns in the parity matrix with a Hamming weight less than or equal to 2 to be lower, and thus better features can be achieved. This third diagonal was selected in such a way that the increase in the complexity of implementation of the codifier is practicably negligible.

The documents previously presented do not interfere with the novelty nor the inventive superiority of the present invention. Although they are all based on utilization of the LDPC technology, which is known in the state of the art, the method and device of this document utilizes a type of quasi-cyclic code (Quasi-Cyclic Low Density Parity Check Code, or QC-LDPC), and applies a parity matrix with a different structure as the central point of the invention.

Throughout this document, a specific nomenclature will be employed to differentiate the elements utilized throughout the description of the invention. A bold capital letter (e.g., A) indicates that the element is a matrix; a bold small letter (e.g., a) indicates that the element is a vector, while a small non-bold letter (e.g., a) indicates that the element is a scalar value. On the other hand, scalar elements that comprise a matrix of the size M×N are indicated in the form a(i,j), where the tuple (i,j) is the position of said element within the matrix, with $0 \le i \le M-1$ being the row number and $0 \le j \le N-1$ the column number. The elements that comprise a vector of size M are annotated in the form a(i), with (i) being the position of the element in the vector ($0 \le i \le M-1$).

Also, throughout the invention the term "cyclical rotation" will be used, which will be defined below. A cyclical rotation z on a vector a=[a(0), a(1), . . . , a(M−2), a(M−1)] consists in cyclically rotating its elements toward the right, obtaining the vector [a((M−z)%M), . . . , a((M−z−1)%M)] as the result, with % being the "module" operator. In the same way, a cyclical rotation z applied over a matrix A=[a(0), . . . , a(N−1)] operates on its columns, obtaining the matrix [a((N−z)%N), . . . , a((N−z−1)%N)] as the result. A cyclical rotation can also be defined in the opposite direction (toward the left) so that a cyclical rotation z toward the right is equivalent to a cyclical rotation M−z and N−z respectively for vector and matrix toward the left.

SUMMARY

In order to achieve the objectives and avoid the drawbacks indicated in above sections, the invention consists of a method and device for communicating data over noisy media. Concretely, the invention presents a method for codifying data used in transmission, its associated codification device, a method for decodifying and its associated decodification device. This group of inventions makes up a unique inventive concept, which will be described below. If the method or device is used in transmission, the equivalent must also be used in reception, and vice versa, so that the data sent can be recovered.

The method for codifying data is applied in transmission and generates parity bits on a block of data in such a way that a code word of N bits is generated from a word of K bits (N>K) that includes protection against errors. Said procedure comprises multiple steps. First a factor b is selected, which is a natural number between 1 and k such that the division of N and K by the factor b will be natural numbers (n=N/b; k=K/b). Below we define a binary model matrix $H_0=[H_a/H_b]$ of size (n−k)×n as the combination of a submatrix corresponding to the positions of the data bits $H_a$ and a submatrix corresponding to the parity bits $H_b$, where said second submatrix $H_b=[hb_0|Hb_1]$ is composed of a column vector of n−k positions $h_{b0}$ and a matrix $H_{b1}$ having a triple diagonal structure, that is, where the elements of the two central diagonals $h_{b1}(i,i), h_{b1}(i+1,i)$ 0≤i≤n−k−2 and the diagonal of the last row $h_{b1}(n-k-1,0)$ are equal to 1, where n−k is the number of rows and columns of the matrix $H_b$, and the rest of the elements are equal to zero. Afterward, the compact matrix $H_1$ is generated and from the compact matrix $H_1$, the parity matrix H. From there, one takes a block of data and uses the parity matrix H on the block of data to determine the parity bits that correspond to said block. Finally, the parity bits are transmitted together with the block of data.

In one implementation of the method, it is possible to eliminate one or more elements of the code word before they are transmitted, reducing the redundancy in the transmission without seriously harming the capacity for protection against errors. This technique is called "puncturing." In this case the word transmitted will have a smaller number of bits than the code word obtained with the initial procedure.

The data codification device comprises means for storing the compact matrix $H_1$ derived from a binary model matrix $H_0=[H_a|H_b]$ formed as the combination of a submatrix corresponding to the position of the data bits $H_a$ and a submatrix corresponding to the parity bits $H_b$, where said second submatrix $H_b=[hb_0|Hb_1]$ is composed of a column vector of n−k positions $h_{b0}$ and a matrix $H_{b1}$ having a triple diagonal structure, that is, where the elements of the two central diagonals $h_{b1}(i,i), h_{b1}(i+1,i)$ 0≤i≤n−k−2 and the diagonal of the last row $h_{b1}(n-k-1,0)$ are equal to 1, where n−k is the number of rows and columns of the matrix $H_b$, and the rest of the elements are equal to zero; and of a microprocessor that takes the block of data, uses the compact matrix $H_1$ to generate the parity matrix H, applies the parity matrix H to the block of data to obtain the parity bits corresponding to the block and adds the parity bits to the block of data before they are transmitted.

In one concrete implementation of this device, one or more elements of the code word are eliminated after adding the parity bits to the block of data but prior to transmission by applying the puncturing technique. In this way the word transmitted will have a smaller number of bits than the code word originally generated.

On the other hand, the data decodification method operates at reception and estimates which is the block of data received from a signal vector received from the channel. From a received code word of N bits (which can have errors due to the channel noise) the K-bit data word that the transmitter wanted to send is obtained. This first takes a signal vector from the channel and the binary model matrix $H_0=[H_a/H_b]$ which is a combination of a submatrix corresponding to the position of the data bits $H_a$ and a submatrix corresponding to the parity bits $H_b$, where said second submatrix $H_b=[hb_0|Hb_1]$ is composed of a column vector of n−k positions $h_{b0}$ and a matrix $H_{b1}$ having a triple diagonal structure, that is, where the elements of the two central diagonals $h_{b1}(i,i), h_{b1}(i+1,i)$ 0≤i≤n−k−2 and the diagonal of the last row $h_{b1}(n-k-1,0)$ are equal to 1, where n−k is the number of rows and columns of the matrix $H_b$, and the rest of the elements are equal to zero. Afterward, the compact matrix $H_1$ is generated and from it, the parity matrix H, and finally the data block is estimated from the vector signal received and the parity matrix H.

If the puncturing technique was used in transmission, the lost data must be recovered at reception. In this case, an indicator value is inserted in the positions eliminated in transmission by the puncturing technique prior to making the estimation of the data block from the signal vector received and the parity matrix.

The data decodification device comprises means for storing the compact matrix $H_1$ that is derived from the binary model matrix $H_0=[H_a/H_b]$ which is a combination of a submatrix corresponding to the position of the data bits $H_a$ and a submatrix corresponding to the parity bits $H_b$, where said second submatrix $H_b[hb_0|Hb_1]$ is composed of a column vector of n−k positions $h_{b0}$ and a triple diagonal structure $H_{b1}$, that is, one in which the elements of the two central diagonals $h_{b1}(i,i), h_{b1}(i+1,i)$ 0≤i≤n−k−2 and the diagonal of the last row $h_{b1}(n-k-1,0)$ are equal to 1, where n−k is the number of rows and columns of the matrix $H_b$, and the rest of the elements are equal to zero; a microprocessor that generates the parity matrix H from the compact matrix $H_1$, applies said parity matrix H to the signal vector received, and estimates the data block received.

If the transmitting device used the puncturing technique, the lost data must be recovered before error correction is done. Therefore, in this implementation and before applying the parity matrix H to the signal vector received, an indicator value is inserted in the positions eliminated in transmission by the puncturing technique.

In one implementation it is possible to use one of the following compact matrices $H_1$ to obtain 336-bit code words with a codification rate of 1/2. The matrix:

| 13 | −1 | 7  | −1 | −1 | 1  | −1 | 1  | −1 | −1 | −1 | −1 | −1 | 0  | −1 | −1 | −1 | −1 | −1 | −1 | −1 | −1 |
|----|----|----|----|----|----|----|----|----|----|----|----|----|----|----|----|----|----|----|----|----|----|
| 5  | −1 | −1 | −1 | 11 | −1 | −1 | −1 | 4  | −1 | 4  | 6  | −1 | 0  | 0  | −1 | −1 | −1 | −1 | −1 | −1 | −1 |
| −1 | 13 | −1 | −1 | −1 | −1 | 11 | −1 | 10 | −1 | 9  | 13 | −1 | −1 | 0  | 0  | −1 | −1 | −1 | −1 | −1 | −1 |
| −1 | −1 | 13 | −1 | −1 | 6  | −1 | 10 | −1 | 5  | −1 | −1 | 4  | −1 | −1 | 0  | 0  | −1 | −1 | −1 | −1 | −1 |
| −1 | −1 | 8  | 8  | 2  | 11 | −1 | −1 | −1 | −1 | −1 | −1 | −1 | −1 | −1 | 0  | 0  | −1 | −1 | −1 | −1 | −1 |
| −1 | 3  | −1 | −1 | −1 | −1 | −1 | 1  | −1 | 4  | 1  | −1 | −1 | −1 | −1 | −1 | 0  | 0  | −1 | −1 | −1 | −1 |
| −1 | −1 | 4  | 2  | −1 | 2  | 9  | −1 | −1 | −1 | −1 | −1 | −1 | −1 | −1 | −1 | −1 | 0  | 0  | −1 | −1 | −1 |
| 2  | −1 | 13 | −1 | 4  | 9  | −1 | −1 | −1 | −1 | −1 | −1 | −1 | −1 | −1 | −1 | −1 | −1 | 0  | 0  | −1 | −1 |
| −1 | 11 | −1 | −1 | −1 | −1 | −1 | −1 | 6  | 4  | 11 | 12 | −1 | −1 | −1 | −1 | −1 | −1 | −1 | 0  | 0  | −1 |
| −1 | −1 | −1 | 10 | −1 | −1 | −1 | −1 | 1  | −1 | 13 | 13 | −1 | −1 | −1 | −1 | −1 | −1 | −1 | −1 | 0  | 0  |
| −1 | −1 | 0  | −1 | −1 | 0  | 2  | 2  | −1 | −1 | −1 | −1 | 0  | −1 | −1 | −1 | −1 | −1 | −1 | −1 | −1 | 0  |
| −1 | −1 | −1 | −1 | −1 | −1 | −1 | −1 | 1  | 2  | 11 | 2  | 4  | 12 | −1 | −1 | −1 | −1 | −1 | −1 | −1 | 0  | or else this matrix:

$$\begin{pmatrix}
-1 & -1 & -1 & 6 & -1 & -1 & 9 & 6 & -1 & -1 & 2 & -1 & -1 & 0 & -1 & -1 & -1 & -1 & -1 & -1 & -1 & -1 & -1 & -1 \\
-1 & 0 & -1 & -1 & -1 & 3 & -1 & 12 & 1 & -1 & -1 & 3 & -1 & 0 & 0 & -1 & -1 & -1 & -1 & -1 & -1 & -1 & -1 & -1 \\
-1 & 9 & 11 & -1 & -1 & 13 & -1 & -1 & 2 & 12 & -1 & -1 & -1 & -1 & 0 & 0 & -1 & -1 & -1 & -1 & -1 & -1 & -1 & -1 \\
1 & -1 & -1 & 11 & -1 & -1 & 7 & -1 & -1 & -1 & 11 & -1 & -1 & -1 & -1 & 0 & 0 & -1 & -1 & -1 & -1 & -1 & -1 & -1 \\
-1 & -1 & -1 & 4 & 8 & -1 & -1 & -1 & -1 & 2 & 5 & 4 & -1 & -1 & -1 & 0 & 0 & -1 & -1 & -1 & -1 & -1 & -1 & -1 \\
-1 & 3 & 0 & -1 & -1 & 8 & -1 & -1 & 1 & -1 & -1 & -1 & -1 & -1 & -1 & -1 & 0 & 0 & -1 & -1 & -1 & -1 & -1 & -1 \\
-1 & -1 & -1 & 0 & 6 & -1 & -1 & -1 & -1 & 5 & 13 & -1 & -1 & -1 & -1 & -1 & -1 & 0 & 0 & -1 & -1 & -1 & -1 & -1 \\
-1 & -1 & -1 & 9 & -1 & -1 & 3 & -1 & -1 & 3 & 1 & -1 & -1 & -1 & -1 & -1 & -1 & -1 & 0 & 0 & -1 & -1 & -1 & -1 \\
9 & 0 & 13 & -1 & -1 & 12 & -1 & -1 & 8 & -1 & -1 & -1 & -1 & -1 & -1 & -1 & -1 & -1 & -1 & 0 & 0 & -1 & -1 & -1 \\
-1 & 5 & -1 & -1 & 1 & 4 & -1 & -1 & 5 & -1 & -1 & -1 & -1 & -1 & -1 & -1 & -1 & -1 & -1 & -1 & 0 & 0 & -1 & -1 \\
-1 & -1 & -1 & 8 & -1 & -1 & 8 & -1 & -1 & 9 & 0 & -1 & 0 & -1 & -1 & -1 & -1 & -1 & -1 & -1 & -1 & 0 & 0 & -1 \\
10 & 11 & -1 & -1 & -1 & 3 & -1 & -1 & 0 & -1 & -1 & -1 & 4 & 8 & -1 & -1 & -1 & -1 & -1 & -1 & -1 & -1 & -1 & 0
\end{pmatrix}$$

In another implementation it is possible to use one of the following compact matrices $H_1$ to obtain 1920-bit code words with a codification rate of 1/2. The matrix:

$$\begin{pmatrix}
-1 & 52 & -1 & 64 & -1 & -1 & 60 & -1 & -1 & -1 & -1 & 1 & -1 & 0 & -1 & -1 & -1 & -1 & -1 & -1 & -1 & -1 & -1 & -1 \\
10 & -1 & -1 & -1 & -1 & 79 & -1 & -1 & 79 & -1 & 78 & 51 & -1 & 0 & 0 & -1 & -1 & -1 & -1 & -1 & -1 & -1 & -1 & -1 \\
9 & -1 & -1 & -1 & -1 & -1 & -1 & 75 & 29 & 72 & 8 & -1 & -1 & -1 & 0 & 0 & -1 & -1 & -1 & -1 & -1 & -1 & -1 & -1 \\
-1 & 52 & 16 & 63 & -1 & -1 & 65 & -1 & -1 & -1 & -1 & 40 & -1 & -1 & 0 & 0 & -1 & -1 & -1 & -1 & -1 & -1 & -1 & -1 \\
-1 & 24 & -1 & -1 & 47 & 1 & 39 & -1 & -1 & -1 & -1 & -1 & -1 & -1 & -1 & 0 & 0 & -1 & -1 & -1 & -1 & -1 & -1 & -1 \\
52 & -1 & -1 & -1 & -1 & -1 & -1 & -1 & 53 & 79 & 48 & -1 & -1 & -1 & -1 & -1 & 0 & 0 & -1 & -1 & -1 & -1 & -1 & -1 \\
-1 & 0 & -1 & -1 & 72 & -1 & 67 & 57 & -1 & -1 & -1 & -1 & -1 & -1 & -1 & -1 & -1 & 0 & 0 & -1 & -1 & -1 & -1 & -1 \\
-1 & 7 & -1 & -1 & -1 & 2 & 50 & -1 & -1 & -1 & -1 & 15 & -1 & -1 & -1 & -1 & -1 & -1 & 0 & 0 & -1 & -1 & -1 & -1 \\
15 & -1 & 19 & -1 & -1 & -1 & -1 & -1 & 75 & 51 & 43 & -1 & -1 & -1 & -1 & -1 & -1 & -1 & -1 & 0 & 0 & -1 & -1 & -1 \\
72 & -1 & -1 & -1 & 38 & -1 & -1 & -1 & 69 & -1 & 62 & -1 & -1 & -1 & -1 & -1 & -1 & -1 & -1 & -1 & 0 & 0 & -1 & -1 \\
-1 & 19 & -1 & 41 & -1 & -1 & 1 & 41 & -1 & -1 & -1 & -1 & 0 & -1 & -1 & -1 & -1 & -1 & -1 & -1 & -1 & 0 & 0 & -1 \\
41 & -1 & 17 & -1 & -1 & -1 & -1 & -1 & 15 & -1 & 30 & -1 & 40 & 6 & -1 & -1 & -1 & -1 & -1 & -1 & -1 & -1 & -1 & 0
\end{pmatrix}$$

or else this matrix:

$$\begin{pmatrix}
27 & -1 & -1 & -1 & 55 & 19 & -1 & 30 & -1 & -1 & -1 & -1 & -1 & 0 & -1 & -1 & -1 & -1 & -1 & -1 & -1 & -1 & -1 & -1 \\
-1 & -1 & 0 & -1 & 1 & -1 & 70 & -1 & 47 & -1 & 62 & -1 & -1 & 0 & 0 & -1 & -1 & -1 & -1 & -1 & -1 & -1 & -1 & -1 \\
-1 & -1 & 41 & -1 & -1 & -1 & 44 & -1 & -1 & 59 & 60 & 25 & -1 & -1 & 0 & 0 & -1 & -1 & -1 & -1 & -1 & -1 & -1 & -1 \\
16 & 77 & -1 & -1 & -1 & 5 & -1 & 48 & -1 & -1 & -1 & -1 & -1 & -1 & -1 & 0 & 0 & -1 & -1 & -1 & -1 & -1 & -1 & -1 \\
-1 & -1 & -1 & 45 & -1 & 27 & -1 & 46 & 19 & -1 & -1 & -1 & -1 & -1 & -1 & -1 & 0 & 0 & -1 & -1 & -1 & -1 & -1 & -1 \\
-1 & -1 & 63 & -1 & -1 & -1 & 55 & -1 & -1 & -1 & 48 & 26 & 10 & -1 & -1 & -1 & -1 & 0 & 0 & -1 & -1 & -1 & -1 & -1 \\
-1 & -1 & -1 & 42 & -1 & 21 & -1 & 58 & -1 & 41 & -1 & -1 & -1 & -1 & -1 & -1 & -1 & -1 & 0 & 0 & -1 & -1 & -1 & -1 \\
-1 & -1 & -1 & -1 & 78 & 0 & -1 & 7 & 52 & -1 & -1 & -1 & -1 & -1 & -1 & -1 & -1 & -1 & -1 & 0 & 0 & -1 & -1 & -1 \\
-1 & 29 & 9 & -1 & -1 & -1 & 37 & -1 & -1 & -1 & 35 & 21 & -1 & -1 & -1 & -1 & -1 & -1 & -1 & -1 & 0 & 0 & -1 & -1 \\
-1 & -1 & 22 & 72 & -1 & -1 & 47 & -1 & -1 & -1 & 0 & -1 & -1 & -1 & -1 & -1 & -1 & -1 & -1 & -1 & -1 & 0 & 0 & -1 \\
35 & -1 & -1 & -1 & -1 & 13 & -1 & 35 & -1 & 70 & -1 & -1 & 0 & -1 & -1 & -1 & -1 & -1 & -1 & -1 & -1 & -1 & 0 & 0 \\
-1 & 46 & 28 & -1 & -1 & -1 & 38 & -1 & -1 & -1 & 8 & -1 & 10 & 58 & -1 & -1 & -1 & -1 & -1 & -1 & -1 & -1 & -1 & 0
\end{pmatrix}$$

In another implementation it is possible to use one of the following compact matrices $H_1$ to obtain 8640-bit code words with a codification rate of 1/2. The matrix:

```
 -1  -1  -1  -1  -1  -1 297 106 328  -1  -1  99  -1   0  -1  -1  -1  -1  -1  -1  -1  -1  -1  -1
290   0 312  -1  32  -1 120  -1  -1  -1  -1  -1   0   0  -1  -1  -1  -1  -1  -1  -1  -1  -1  -1
183  57  -1  -1 187  68  -1  -1  -1 260  -1  81  -1   0   0  -1  -1  -1  -1  -1  -1  -1  -1  -1
 -1  -1  -1 323  -1  -1  -1 137 354  -1  -1 162  -1  -1  -1   0   0  -1  -1  -1  -1  -1  -1  -1
 -1  -1 228  -1  -1  -1  -1 224  -1 114  -1 245  -1  -1  -1  -1   0   0  -1  -1  -1  -1  -1  -1
113  98  -1  -1 120  23  -1  -1  -1  -1  -1  -1  -1  -1  -1  -1  -1   0   0  -1  -1  -1  -1  -1
 -1  -1  -1  -1  -1  -1  -1 138  -1 187  45  62  -1  -1  -1  -1  -1  -1   0   0  -1  -1  -1  -1
 -1  -1 142  -1  -1  -1 347  67  -1  -1  -1  46  -1  -1  -1  -1  -1  -1  -1   0   0  -1  -1  -1
328 265  -1  66 156  96  -1  -1  -1  -1  -1  -1  -1  -1  -1  -1  -1  -1  -1  -1   0   0  -1  -1
212 184  -1  -1 102  -1  -1  -1 120  -1  -1  -1  -1  -1  -1  -1  -1  -1  -1  -1  -1   0   0  -1
 -1  -1  -1  -1  -1  -1  80  15  -1 329 153   0  -1  -1  -1  -1  -1  -1  -1  -1  -1  -1   0   0
207  70  -1   7 235  -1  -1  -1  -1  -1  81 185  -1  -1  -1  -1  -1  -1  -1  -1  -1  -1  -1   0
``` or else the matrix:

```
 -1  34  -1  95  -1 279  -1  -1  -1  -1 248  -1  -1   0  -1  -1  -1  -1  -1  -1  -1  -1  -1  -1
 -1  -1   0  -1   0  -1  -1  -1  -1 134 356 275  -1   0   0  -1  -1  -1  -1  -1  -1  -1  -1  -1
 51  -1  27  -1  -1  -1  -1  -1  22 152  -1  57  -1  -1   0   0  -1  -1  -1  -1  -1  -1  -1  -1
 -1 124  -1 290  -1 281  15  -1  -1  -1  -1  -1  -1  -1  -1   0   0  -1  -1  -1  -1  -1  -1  -1
 -1 340  -1  99 336  -1  -1  -1  -1  -1  -1  33  -1  -1  -1  -1   0   0  -1  -1  -1  -1  -1  -1
163  -1  46  -1  -1  -1  -1  -1 306  -1  86  -1  -1  -1  -1  -1  -1   0   0  -1  -1  -1  -1  -1
 -1 185  -1  24  -1  -1  -1  94   0  -1  -1  -1  -1  -1  -1  -1  -1  -1   0   0  -1  -1  -1  -1
 -1 223  -1 225 325  -1  -1  -1  -1 297  -1  -1  -1  -1  -1  -1  -1  -1  -1   0   0  -1  -1  -1
 46  -1 314  -1  -1  -1  59  -1  -1  67  -1 120  -1  -1  -1  -1  -1  -1  -1  -1   0   0  -1  -1
 -1  -1 121  -1  -1  -1 161  -1 303  -1 264  -1  -1  -1  -1  -1  -1  -1  -1  -1  -1   0   0  -1
 -1 303  -1   8  -1 185  -1  -1 138  -1  -1  -1   0  -1  -1  -1  -1  -1  -1  -1  -1  -1   0   0
 -1  -1 312  -1  -1  -1 100  -1  -1 144  -1 307  33 166  -1  -1  -1  -1  -1  -1  -1  -1  -1   0
```

In another implementation it is possible to use the following compact matrix $H_1$ to obtain 1440-bit code words with a codification rate of 2/3.

```
 49  -1  -1  21  31  -1  57  -1  -1  19  -1  29   2  -1  19  -1  -1   0  -1  -1  -1  -1  -1  -1
 -1   7  22  -1  -1  37  -1  32  10  -1  26  -1  -1  59  -1  48  -1   0   0  -1  -1  -1  -1  -1
 53  -1  -1  20  50  -1  -1   3  16  -1  49  -1  -1  28  14  -1  -1  -1   0   0  -1  -1  -1  -1
 -1  58  23  -1  -1  15  54  -1  -1   5  -1  18  49  -1  -1  13  -1  -1  -1   0   0  -1  -1  -1
 55  -1  -1  58  -1   9  -1  26  57  -1  41  -1  31  -1  21  -1  -1  -1  -1  -1   0   0  -1  -1
 -1  10  49  -1  59  -1   7  -1  -1  30  -1  18  -1  48  -1   7  59  -1  -1  -1  -1   0   0  -1
 48  -1  -1  50  18  -1  -1  11  52  -1  59  -1  -1  37  -1  10   0  -1  -1  -1  -1  -1   0   0
 -1  24  16  -1  -1   0  53  -1  -1  41  -1  38  51  -1  58  -1  59   8  -1  -1  -1  -1  -1   0
```

In another implementation it is possible to use the following compact matrix $H_1$ to obtain 6480-bit code words with a codification rate of 2/3:

```
 78  -1  -1 167 237  -1   3  -1 266  -1  -1   1 n02 153  -1  -1 212  -1   0  -1  -1  -1  -1  -1
 -1  83 189  -1  -1  68  -1 178  -1  90 205  -1  -1  13   4  -1  -1   0   0  -1  -1  -1  -1  -1
 -1 226 147  -1  46  -1  -1  76  -1 116  -1 211  -1 112  -1 118  -1  -1   0   0  -1  -1  -1  -1
 92  -1  -1 214  -1 236 241  -1 157  -1 143  -1 214  -1 207  -1  -1  -1  -1   0   0  -1  -1  -1
144  -1  -1 258 264  -1  53  -1 114  -1 172  -1  -1  82 262  -1  62  -1  -1  -1   0   0  -1  -1
 -1 153 120  -1  -1 199  -1 126  -1  61  -1 183  15  -1  -1 134  -1  -1  -1  -1  -1   0   0  -1
 -1 100  -1 141  -1  36  -1  17  -1 156  -1 124 162  -1  -1  57   0  -1  -1  -1  -1  -1   0   0
196  -1 187  -1  73  -1  80  -1 139  -1  57  -1  -1 236 267  -1  62 256  -1  -1  -1  -1  -1   0
```

In another implementation it is possible to use the following compact matrix $H_1$ to obtain 1152-bit code words with a codification rate of 5/6:

$$\begin{bmatrix} -1 & 13 & 32 & 47 & 41 & 24 & -1 & 25 & 22 & 40 & 1 & 31 & 8 & 15 & 20 & 15 & 42 & 30 & 13 & 3 & -1 & 0 & -1 & -1 \\ 25 & 46 & 15 & 43 & 45 & 29 & 39 & 47 & 23 & 38 & 39 & 12 & -1 & 21 & -1 & 38 & 33 & 0 & 0 & -1 & 39 & 0 & 0 & -1 \\ 35 & 45 & 45 & 38 & 14 & 16 & 6 & 11 & -1 & 18 & 7 & 41 & 35 & 17 & 32 & 45 & 41 & -1 & 18 & 17 & 0 & -1 & 0 & 0 \\ 9 & 32 & 6 & 22 & 26 & 31 & 9 & 8 & 22 & 32 & 40 & 4 & 18 & 40 & 36 & -1 & -1 & 23 & 31 & 41 & 39 & 20 & -1 & 0 \end{bmatrix}$$

In another implementation it is possible to use the following compact matrix $H_1$ to obtain 5184-bit code words with a codification rate of 5/6:

$$\begin{bmatrix} -1 & 47 & 146 & 203 & 184 & 112 & -1 & 116 & 103 & 181 & 3 & 140 & 38 & 68 & 91 & 71 & 191 & 138 & 62 & 14 & -1 & 0 & -1 & -1 \\ 117 & 203 & 67 & 194 & 206 & 133 & 174 & 212 & 104 & 171 & 176 & 56 & -1 & 96 & -1 & 167 & 149 & 4 & 1 & -1 & 177 & 0 & 0 & -1 \\ 153 & 206 & 198 & 173 & 55 & 72 & 28 & 53 & -1 & 82 & 34 & 186 & 161 & 80 & 144 & 204 & 187 & -1 & 84 & 77 & 0 & -1 & 0 & 0 \\ 44 & 147 & 27 & 83 & 118 & 130 & 41 & 38 & 100 & 146 & 183 & 19 & 85 & 180 & 163 & -1 & -1 & 106 & 140 & 185 & 177 & 94 & -1 & 0 \end{bmatrix}$$

One implementation in which the puncturing technique is used starts with an 1152-bit code word and codification rate of 5/6 and applies the following puncturing pattern:

$$pp_{1152}^{(16/18)} = \left[\underbrace{1\ 1\ \ldots\ 1}_{720}\ \underbrace{0\ 0\ \ldots\ 0}_{36}\ \underbrace{1\ 1\ \ldots\ 1}_{360}\ \underbrace{0\ 0\ \ldots\ 0}_{36}\right]$$

in order to obtain a 1080-bit code word and codification rate of 16/18.

Another implementation in which the puncturing technique is used starts with a code word with 5184 bits and a codification rate of 5/6 and applies the following puncturing pattern $$pp_{5184}^{(16/18)} = \left[\underbrace{1\ 1\ \ldots\ 1}_{3240}\ \underbrace{0\ 0\ \ldots\ 0}_{162}\ \underbrace{1\ 1\ \ldots\ 1}_{972}\ \underbrace{0\ 0\ \ldots\ 0}_{162}\ \underbrace{1\ 1\ \ldots\ 1}_{648}\right]$$

to obtain a code word of 4860 bits and codification rate of 16/18.

Another implementation in which the puncturing technique is used starts with a code word with 1152 bits and a codification rate of 5/6 and applies the following puncturing pattern $$pp_{1152}^{(20/21)} = \left[\underbrace{1\ 1\ \ldots\ 1}_{720}\ \underbrace{0\ 0\ \ldots\ 0}_{48}\ \underbrace{1\ 1\ \ldots\ 1}_{240}\ \underbrace{0\ 0\ \ldots\ 0}_{96}\ \underbrace{1\ 1\ \ldots\ 1}_{48}\right]$$

to obtain a 1008-bit code word and codification rate of 20/21.

And last, a final implementation in which the puncturing technique is used starts with a 5184-bit code word and codification rate of 5/6 and applies the following puncturing pattern $$pp_{5184}^{(20/21)} = \left[\underbrace{0\ 0\ \ldots\ 0}_{216}\ \underbrace{1\ 1\ \ldots\ 1}_{4320}\ \underbrace{0\ 0\ \ldots\ 0}_{432}\ \underbrace{1\ 1\ \ldots\ 1}_{216}\right]$$

to obtain a 4536-bit code word and codification rate of 20/21.

Below, in order to facilitate a greater understanding of this descriptive document, is given the description, by way of illustration but not limitation, of one example implementation of the invention. This forms an integral part of the same document.

BRIEF DESCRIPTION OF DRAWINGS

The present disclosure will become more fully understood from the detailed description and the accompanying drawings, wherein.

DESCRIPTION

Figure 1:
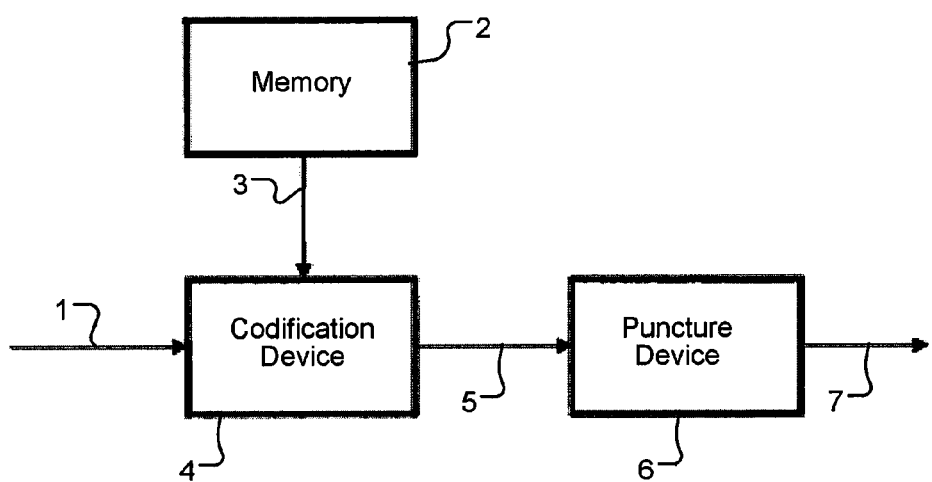
FIG. 1 is a block diagram of the codifier in the transmitter.

Following is the description of one example of implementation of the invention, making reference to the numbering adopted in the figures.

The problem that the invention procedure is intended to solve, from a theoretical point of view, consists of success in optimizing correction of errors in data communication using low-cost hardware implementations and LDPC codes.

An LDPC code is a linear code that operates on blocks of data. The code is defined by its parity matrix H. In this implementation example the codes are binary codes, but it is possible to generalize the invention to codes on any Galois field GF(q), where q is ≥2.

In transmission, blocks of data are composed of K bits. Said data block is designated as u=[u(0), u(1), . . . , u(K−1)]. After applying the method of the invention, a word is generated of a linear code v=[v(0), v(1), . . . , v(N−1)] with N bits (where N<K). Said code is generated through the product v=uG, where G is a binary matrix K×N, generator of the LDPC code. The set of possible codes generated is called set C, and the codification rate of the code will be R=K/N.

Therefore, it is possible to define a code C of codification R as the set of vectors v∈C generated by all the possible $2^K$ binary vectors by applying the generator matrix G to them. An equivalent definition would be that C is the vectorial space of size N included in the base composed of the K rows of the matrix G. Another alternative form of defining code C is through its parity matrix H, which is the form most used in the state of the art. This matrix, in size (N−K)×N, has as rows the base of the dual space C, and therefore $GH^T=0$. Any vector of the code satisfies $$vH^T=0$$

(where "T" is the transposition operator).

At the time these codes are utilized from a practical viewpoint, it is preferable to consider the codes as systematic codes, that is, those in which the bits of the code word are between the data bits. Without losing generality, this example is centered on the case where v=[u|p], where p=[p(0), p(1), . . . p(N−K−1)] is a vector composed of the parity bits, u the data block that is to be transmitted and v the code word actually transmitted (after including the LDPC code).

Below is shown an example of implementation in which the relation between the parity matrix and a code word can be observed. In this example, the code has a codification rate of R=1/2 and is defined by the following parity matrix:

$$H = \begin{bmatrix} 1 & 1 & 0 & 1 & 0 & 1 & 0 & 0 & 1 & 1 \\ 1 & 1 & 1 & 0 & 0 & 1 & 0 & 1 & 0 & 1 \\ 1 & 1 & 1 & 0 & 1 & 0 & 1 & 0 & 1 & 0 \\ 0 & 0 & 1 & 1 & 1 & 1 & 1 & 1 & 0 & 0 \\ 0 & 0 & 0 & 1 & 1 & 0 & 1 & 1 & 1 & 1 \end{bmatrix}$$

In this matrix, the left section corresponds to the K=5 data bits, while the right section corresponds to the N−K=5 parity bits. By applying the equation $vH^T=0$ to the matrix H the following system of equations is obtained:

$$\begin{cases} u(0)+u(1)+u(3)+p(0)+p(3)+p(4)=0 \\ u(0)+u(1)+u(2)+p(0)+p(2)+p(4)=0 \\ u(0)+u(1)+u(2)+u(4)+p(1)+p(3)=0 \\ u(2)+u(3)+u(4)+p(0)+p(1)+p(2)=0 \\ u(3)+u(4)+p(1)+p(2)+p(3)+p(4)=0 \end{cases}$$

Figure 3:
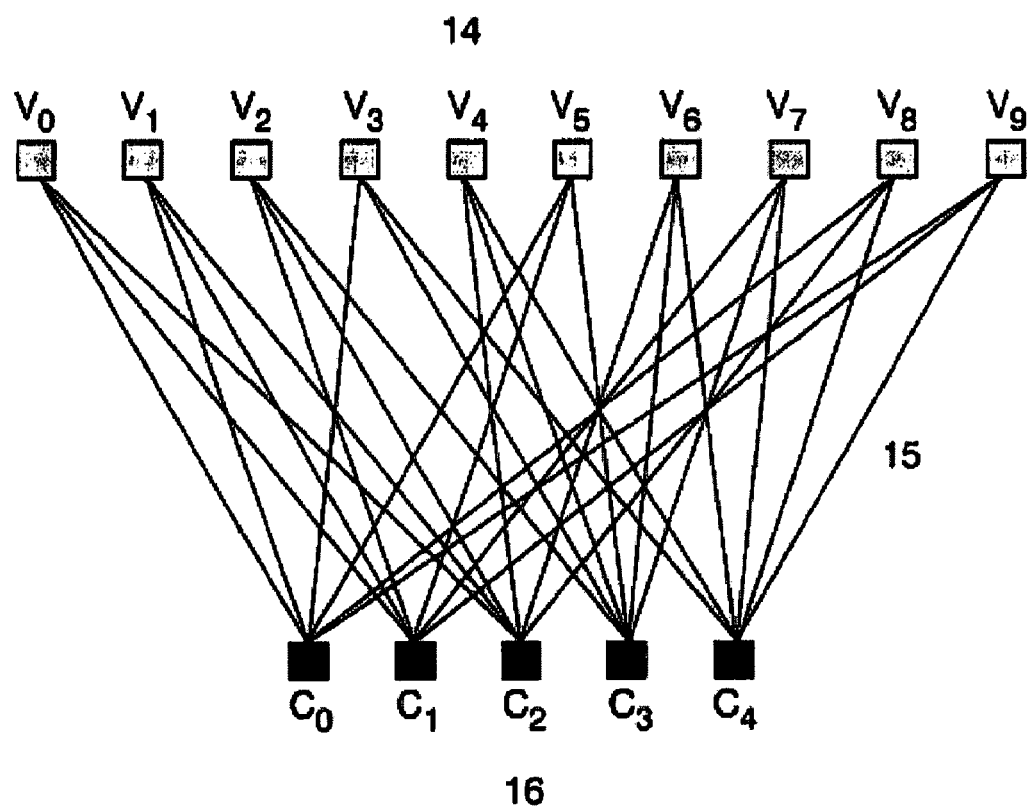
FIG. 3 is a two-part graph of the matrix H of the example.

An LDPC code can also be represented in graphic form with a two-part graph called a Tanner graph. In a Tanner graph the vertices or nodes are classified in two separate groups or sets: the "variable nodes", which represent the bits of the code word, and the "check nodes," which represent the parity relationships. Between both sets of nodes are found the possible edges that define the parity equation. In the case of the code defined in the preceding example, its corresponding graph is represented in FIG. 3, where we find 10 variable nodes (14) and 5 check nodes (16), united by multiple edges (15). Each check node is united through edges to 6 variable nodes, as represented in the preceding system of equations. It can be observed that the graph has as many control and variable nodes as the corresponding parity matrix has rows and columns, and that an edge is found between the check node i and variable node j when the element h(i,j) of the matrix, that is, the one located in the row i=0, . . . , N−K−1 and column j=0, . . . , N−1 is non-zero.

On the other hand, cycles can be defined on LDPC codes, where a cycle of length 2c is defined as the path of 2c length edges that processes c check nodes and c variable nodes in the Tanner graph that represents the code before returning to the same beginning node. To optimize the features of the code, it can be demonstrated that it is of vital importance that the number of short cycles be the minimum possible. The cycle of minimum length is called girth. It is particularly desirable that the girth be greater than 4 in order avoid reducing the features of an iterative decodifier.

In the original description, R. Gallagher presented codes whose parity matrices were generated randomly. In the state of the art it is generally known that in order to obtain good features, near the Shannon limit, the size of the code must be relatively large, and as a consequence of that, the parity matrix must be large. The problem is that matrices that are large and generated randomly cause difficulty in the implementation of both the codifier and decodifier. One way to avoid this difficulty is to use matrices with a regular structure. Following are the necessary steps for generating a regular structure:

1. First, one generates a binary model matrix $H_0$ of size (n−k)×n where n<N, k<K and R=k/n=K/N. If the Hamming weight of the columns and rows of $H_0$ is constant, the generated code is called regular LDPC. However, better features can be obtained if the matrix is irregular, that is, if the weights of the columns follow a statistical distribution dependent upon the codification rate and of the channel where the data transmission will finally be done.
2. Once the binary model matrix $H_0$ has been obtained, the compact matrix $H_1$ is generated, replacing each element of $H_0$ that is equal to "1" with a pseudo-random positive whole number 0≤x<b (where b=N/n) and each element equal to "0" with the value −1.
3. To obtain the parity matrix H, the positive elements of $H_1$ are replaced by an identity submatrix rotated cyclically the number of times indicated by the value of the positive element of $H_1$ in question, and the elements equal to −1 are replaced by a null submatrix of the same size. The size of these submatrices will also be b×b.

The result is a parity matrix H of size (N−K)×N which defines an LDPC code with codification rate R=K/N. The grade of density (sparseness) of the matrix will depend upon the size of b. Generally, the larger b is, the better the features that are obtained by using an iterative decodifier.

If the cycles of the generated matrix (Tanner graph) turn out to be very short, step 2 (or even step 1 if necessary) should be applied for the purpose of improving these properties.

In order to facilitate the implementation of the codifier, it is necessary to generate the binary model matrix $H_0$ in a specific form. First, said matrix is divided into two parts $H_0=[H_a|H_b]$ where the submatrix $H_a$ corresponds to the positions of the data bits and $H_b$ to the parity bits. The first submatrix is generated pseudo-randomly in the way described previously. However, the second section is usually deterministic.

This second section $H_b$, according to the state of the art and intended to facilitate the design of an efficient codifier, takes one of the following two forms; the first form is $$H_b = [h_{b0} | H_{b1}] = \begin{bmatrix} h_b(0) & & 1 & 0 & & & 0 \\ h_b(1) & & 1 & 1 & \ddots & & \\ & & 0 & 1 & \ddots & \ddots & \\ & & & & \ddots & \ddots & 1 & 0 \\ & & & & & \ddots & 1 & 1 \\ h_b(n-k-1) & & 0 & & & & 0 & 1 \end{bmatrix}$$

where the first section is a pseudo-random column vector having a Hamming weight greater than 2 and $H_{b1}$ is a double-diagonal matrix whose elements $h_{b1}(i,j)$ are equal to "1" when $i=j, i=j+1$ and equal to "0" in the remaining positions.

The second way of generating $H_b$ is totally double diagonal $$H_b = \begin{bmatrix} 1 & 0 & & & & 0 \\ 1 & 1 & \ddots & & & \\ 0 & 1 & \ddots & & & \\ & & \ddots & \ddots & \ddots & \ddots \\ & & & \ddots & 1 & 1 & 0 \\ 0 & & & & 0 & 1 & 1 \end{bmatrix}$$

where the elements of the submatrix $h_b(i,j)$ are equal to "1" when $i=j, i=j+1$ and equal to zero in the remaining positions.

Figure 4:
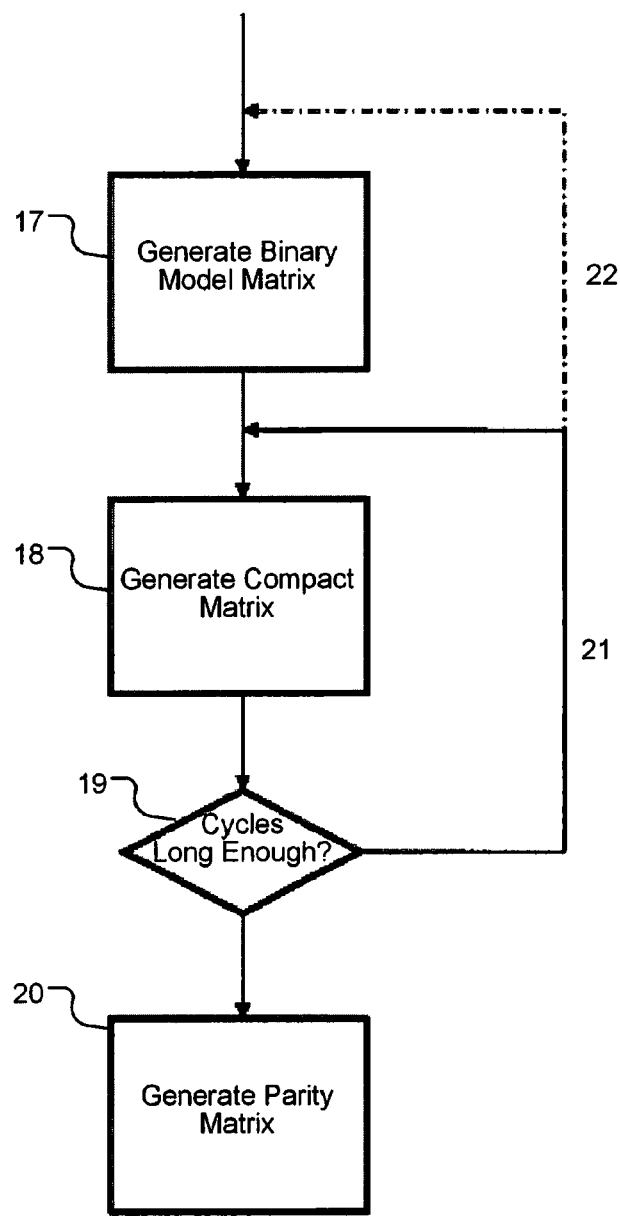
FIG. 4 is a flow diagram of the construction of a structured LDPC code.

Once this base matrix structure has been generated, the compact matrix $H_1$ is generated, in the form previously described with the sole exception that in the double diagonal part of $H_b$, the "1"s are replaced by the same positive whole number and the "0"s by "−1." Also, the final parity matrix is obtained by changing the positive wholes by identities rotated cyclically and the negatives by a null submatrix. The procedure can be observed graphically in FIG. 4, where block (17) generates the binary model matrix $H_0$, block (18) generates the compact matrix $H_1$, block (19) decides whether the cycles are long enough, and the process goes on to generate the parity matrix H with block 20, or else if the cycles are short, the model matrix (21) or else the base matrix (22) is generated again.

The method and device of the invention together modify the structure of the parity matrix known in the state of the art in order to facilitate the final implementation of the codification and decodification and improve the features. For this, the proposed structure consists in that the section of the binary model $H_0$ corresponding to the parity bits has the following form:

$$H_b = [h_{b0} | H_{b1}] = \begin{bmatrix} h_{b0}(0) & & 1 & 0 & & & 0 \\ h_{b1}(1) & & 1 & 1 & \ddots & & \\ & & 0 & 1 & \ddots & \ddots & \\ & & & & \ddots & \ddots & 1 & 0 \\ & & & & & \ddots & 1 & 1 \\ h_{b0}(n-k-1) & & 1 & & & & 0 & 1 \end{bmatrix}$$

where the structure $H_{b1}$ is triple diagonal, that is, in addition to the elements of the two central diagonals $h_{b1}(I,i)$, $h_{b1}(i-1,i)$, the element of the diagonal of the last line $h_{b1}(n-k-1,0)$ is also equal to "1." The compact matrix is generated in the way described previously except that the element of the last row equal to "1" is replaced by a strictly positive whole $w \geq 0$.

A binary model matrix $H_0$ for $r=1/2$ with $n=24$ and $k=12$ might have the following structure:

```
1 0 1 0 0 1 0 1 0 0 0 0 1 0 0 0 0 0 0 0 0 0 0 0
1 0 0 0 1 0 0 0 1 0 1 1 0 1 1 0 0 0 0 0 0 0 0 0
0 1 0 0 0 0 1 0 1 0 1 1 0 0 1 1 0 0 0 0 0 0 0 0
0 0 1 0 0 1 0 1 0 1 0 0 1 0 0 1 1 0 0 0 0 0 0 0
0 0 1 1 1 1 0 0 0 0 0 0 0 0 0 1 1 0 0 0 0 0 0 0
0 1 0 0 0 0 0 0 1 0 1 1 0 0 0 0 1 1 0 0 0 0 0 0
0 0 1 1 0 1 1 0 0 0 0 0 0 0 0 0 0 1 1 0 0 0 0 0
1 0 1 0 1 1 0 0 0 0 0 0 0 0 0 0 0 0 1 1 0 0 0 0
0 1 0 0 0 0 0 0 1 1 1 1 0 0 0 0 0 0 0 1 1 0 0 0
0 0 0 1 0 0 0 0 1 0 1 1 0 0 0 0 0 0 0 0 1 1 0 0
0 0 1 0 0 1 1 1 0 0 0 0 1 0 0 0 0 0 0 0 0 0 1 1
0 0 0 0 0 0 0 0 1 1 1 1 1 1 0 0 0 0 0 0 0 0 0 1
```

A compact matrix $H_1$ derived from the preceding by a block size N=336 and therefore having an expansion factor b=14 would be the following:

```
13  -1   7  -1  -1   1  -1   1  -1  -1  -1  -1  -1   0  -1  -1  -1  -1  -1  -1  -1  -1  -1  -1
 5  -1  -1  -1  11  -1  -1  -1   4  -1   4   6  -1   0   0  -1  -1  -1  -1  -1  -1  -1  -1  -1
-1  13  -1  -1  -1  -1  11  -1  10  -1   9  13  -1  -1   0   0  -1  -1  -1  -1  -1  -1  -1  -1
-1  -1  13  -1  -1   6  -1  10  -1   5  -1  -1   4  -1  -1   0   0  -1  -1  -1  -1  -1  -1  -1
-1  -1   8   8   2  11  -1  -1  -1  -1  -1  -1  -1  -1  -1  -1   0   0  -1  -1  -1  -1  -1  -1
-1   3  -1  -1  -1  -1  -1  -1   1  -1   4   1  -1  -1  -1  -1  -1   0   0  -1  -1  -1  -1  -1
-1  -1   4   2  -1   2   9  -1  -1  -1  -1  -1  -1  -1  -1  -1  -1  -1   0   0  -1  -1  -1  -1
 2  -1  13  -1   4   9  -1  -1  -1  -1  -1  -1  -1  -1  -1  -1  -1  -1  -1   0   0  -1  -1  -1
-1  11  -1  -1  -1  -1  -1  -1   6   4  11  12  -1  -1  -1  -1  -1  -1  -1  -1   0   0  -1  -1
-1  -1  -1  10  -1  -1  -1   1  -1  13  13  -1  -1  -1  -1  -1  -1  -1  -1  -1  -1   0   0  -1
-1  -1   0  -1  -1   0   2   2  -1  -1  -1   0  -1  -1  -1  -1  -1  -1  -1  -1  -1  -1   0   0
-1  -1  -1  -1  -1  -1  -1  -1   1   2  11   2   4  12  -1  -1  -1  -1  -1  -1  -1  -1  -1   0
``` or as preferred, the following matrix can be used as an alternative:

```
-1  -1  -1   6  -1  -1   9   6  -1  -1   2  -1  -1   0  -1  -1  -1  -1  -1  -1  -1  -1  -1  -1
-1   0  -1  -1  -1   3  -1  12   1  -1  -1   3  -1   0   0  -1  -1  -1  -1  -1  -1  -1  -1  -1
-1   9  11  -1  -1  13  -1  -1   2  12  -1  -1  -1  -1   0   0  -1  -1  -1  -1  -1  -1  -1  -1
 1  -1  -1  11  -1  -1   7  -1  -1  -1  11  -1  -1  -1  -1   0   0  -1  -1  -1  -1  -1  -1  -1
-1  -1  -1   4   8  -1  -1  -1  -1   2   5   4  -1  -1  -1   0   0  -1  -1  -1  -1  -1  -1  -1
-1   3   0  -1  -1   8  -1  -1   1  -1  -1  -1  -1  -1  -1  -1   0   0  -1  -1  -1  -1  -1  -1
-1  -1  -1   0   6  -1  -1  -1  -1   5  13  -1  -1  -1  -1  -1  -1   0   0  -1  -1  -1  -1  -1
-1  -1  -1   9  -1  -1  -1   3  -1  -1   3   1  -1  -1  -1  -1  -1  -1   0   0  -1  -1  -1  -1
 9   0  13  -1  -1  12  -1  -1   8  -1  -1  -1  -1  -1  -1  -1  -1  -1  -1   0   0  -1  -1  -1
-1   5  -1  -1   1   4  -1  -1   5  -1  -1  -1  -1  -1  -1  -1  -1  -1  -1  -1   0   0  -1  -1
-1  -1  -1   8  -1  -1   8  -1  -1   9   0  -1   0  -1  -1  -1  -1  -1  -1  -1  -1   0   0  -1
-1  -1  -1   8  -1  -1   8  -1  -1   9   0  -1   0  -1  -1  -1  -1  -1  -1  -1  -1  -1   0   0
10  11  -1  -1  -1   3  -1  -1   0  -1  -1  -1   4   8  -1  -1  -1  -1  -1  -1  -1  -1  -1   0
```

For a different block size we can define a different compact matrix that can derive from the same binary model matrix or from another, different one.

To obtain code words of 1920 bits with a codification rate of 1/2, the following matrix can be used:

```
-1  52  -1  64  -1  -1  60  -1  -1  -1  -1   1  -1   0  -1  -1  -1  -1  -1  -1  -1  -1  -1  -1
10  -1  -1  -1  -1  79  -1  -1  79  -1  78  51  -1   0   0  -1  -1  -1  -1  -1  -1  -1  -1  -1
 9  -1  -1  -1  -1  -1  -1  75  29  72   8  -1  -1  -1   0   0  -1  -1  -1  -1  -1  -1  -1  -1
-1  52  16  63  -1  -1  65  -1  -1  -1  -1  40  -1  -1   0   0  -1  -1  -1  -1  -1  -1  -1  -1
-1  24  -1  -1  47   1  39  -1  -1  -1  -1  -1  -1  -1  -1   0   0  -1  -1  -1  -1  -1  -1  -1
52  -1  -1  -1  -1  -1  -1  53  79  48  -1  -1  -1  -1  -1  -1   0   0  -1  -1  -1  -1  -1  -1
-1   0  -1  -1  72  -1  67  57  -1  -1  -1  -1  -1  -1  -1  -1  -1   0   0  -1  -1  -1  -1  -1
-1   7  -1  -1  -1   2  50  -1  -1  -1  15  -1  -1  -1  -1  -1  -1  -1   0   0  -1  -1  -1  -1
15  -1  19  -1  -1  -1  -1  -1  75  51  43  -1  -1  -1  -1  -1  -1  -1  -1   0   0  -1  -1  -1
72  -1  -1  -1  38  -1  -1  -1  69  -1  62  -1  -1  -1  -1  -1  -1  -1  -1  -1   0   0  -1  -1
-1  19  -1  41  -1  -1   1  41  -1  -1  -1  -1   0  -1  -1  -1  -1  -1  -1  -1  -1   0   0  -1
41  -1  17  -1  -1  -1  -1  -1  15  -1  30  -1  40   6  -1  -1  -1  -1  -1  -1  -1  -1  -1   0
``` or else, preferably, the matrix:

```
27  -1  -1  -1  55  19  -1  30  -1  -1  -1  -1   0  -1  -1  -1  -1  -1  -1  -1  -1  -1  -1  -1
-1  -1   0  -1   1  -1  70  -1  47  -1  62  -1  -1   0   0  -1  -1  -1  -1  -1  -1  -1  -1  -1
-1  -1  41  -1  -1  -1  44  -1  -1  59  60  25  -1  -1   0   0  -1  -1  -1  -1  -1  -1  -1  -1
16  77  -1  -1  -1   5  -1  48  -1  -1  -1  -1  -1  -1  -1   0   0  -1  -1  -1  -1  -1  -1  -1
-1  -1  -1  45  -1  27  -1  46  19  -1  -1  -1  -1  -1  -1  -1   0   0  -1  -1  -1  -1  -1  -1
-1  -1  63  -1  -1  -1  55  -1  -1  -1  48  26  10  -1  -1  -1  -1   0   0  -1  -1  -1  -1  -1
-1  -1  -1  42  -1  21  -1  58  -1  41  -1  -1  -1  -1  -1  -1  -1  -1   0   0  -1  -1  -1  -1
-1  -1  -1  -1  78   0  -1   7  52  -1  -1  -1  -1  -1  -1  -1  -1  -1  -1   0   0  -1  -1  -1
-1  29   9  -1  -1  -1  37  -1  -1  -1  35  21  -1  -1  -1  -1  -1  -1  -1  -1   0   0  -1  -1
-1  -1  22  72  -1  -1  47  -1  -1  -1   0  -1  -1  -1  -1  -1  -1  -1  -1  -1  -1   0   0  -1
35  -1  -1  -1  -1  13  -1  35  -1  70  -1  -1   0  -1  -1  -1  -1  -1  -1  -1  -1  -1   0   0
-1  46  28  -1  -1  -1  38  -1  -1  -1   8  -1  10  58  -1  -1  -1  -1  -1  -1  -1  -1  -1   0
```

A compact matrix for N=8640 bits with expansion factor 360 derived from a different binary model matrix would be the following:

```
-1  -1  -1  -1  -1  -1 297 106 328  -1  -1  99  -1   0  -1  -1  -1  -1  -1  -1  -1  -1  -1  -1
290   0 312  -1  32  -1 120  -1  -1  -1  -1  -1  -1   0   0  -1  -1  -1  -1  -1  -1  -1  -1  -1
183  57  -1  -1 187  68  -1  -1  -1  -1 260  -1  81  -1   0   0  -1  -1  -1  -1  -1  -1  -1  -1
 -1  -1  -1 323  -1  -1  -1 137 354  -1  -1 162  -1  -1  -1   0   0  -1  -1  -1  -1  -1  -1  -1
 -1  -1 228  -1  -1  -1  -1 224  -1 114  -1 245  -1  -1  -1  -1   0   0  -1  -1  -1  -1  -1  -1
113  98  -1  -1 120  23  -1  -1  -1  -1  -1  -1  -1  -1  -1  -1  -1   0   0  -1  -1  -1  -1  -1
 -1  -1  -1  -1  -1  -1  -1 138  -1 187  45  62  -1  -1  -1  -1  -1  -1   0   0  -1  -1  -1  -1
 -1  -1 142  -1  -1  -1 347  67  -1  -1  -1  46  -1  -1  -1  -1  -1  -1  -1   0   0  -1  -1  -1
328 265  -1  66 156  96  -1  -1  -1  -1  -1  -1  -1  -1  -1  -1  -1  -1  -1  -1   0   0  -1  -1
212 184  -1  -1 102  -1  -1  -1 120  -1  -1  -1  -1  -1  -1  -1  -1  -1  -1  -1  -1   0   0  -1
 -1  -1  -1  -1  -1  -1  -1  80  15  -1 329 153   0  -1  -1  -1  -1  -1  -1  -1  -1  -1   0   0
207  70  -1   7 235  -1  -1  -1  -1  -1  -1  -1  81 185  -1  -1  -1  -1  -1  -1  -1  -1  -1   0
```

Another preferential alternative for obtaining code words of 8640 bits with a codification rate of 1/2 is the matrix:

```
 -1  34  -1  95  -1 279  -1  -1  -1  -1 248  -1  -1   0  -1  -1  -1  -1  -1  -1  -1  -1  -1  -1
 -1  -1   0  -1   0  -1  -1  -1  -1 134 356 275  -1   0   0  -1  -1  -1  -1  -1  -1  -1  -1  -1
 51  -1  27  -1  -1  -1  -1  -1  22 152  -1  57  -1  -1   0   0  -1  -1  -1  -1  -1  -1  -1  -1
 -1 124  -1 290  -1 281  15  -1  -1  -1  -1  -1  -1  -1  -1   0   0  -1  -1  -1  -1  -1  -1  -1
 -1 340  -1  99 336  -1  -1   1  -1  -1  -1  -1  33  -1  -1  -1   0   0  -1  -1  -1  -1  -1  -1
163  -1  46  -1  -1  -1  -1  -1 306  -1  86  -1  -1  -1  -1  -1  -1   0   0  -1  -1  -1  -1  -1
 -1 185  -1  24  -1  -1  -1  94   0  -1  -1  -1  -1  -1  -1  -1  -1  -1   0   0  -1  -1  -1  -1
 -1 223  -1 225 325  -1  -1  -1  -1 297  -1  -1  -1  -1  -1  -1  -1  -1  -1   0   0  -1  -1  -1
 46  -1 314  -1  -1  -1  59  -1  -1  67  -1 120  -1  -1  -1  -1  -1  -1  -1  -1   0   0  -1  -1
 -1  -1 121  -1  -1  -1 161  -1 303  -1 264  -1  -1  -1  -1  -1  -1  -1  -1  -1  -1   0   0  -1
 -1 303  -1   8  -1 185  -1  -1 138  -1  -1  -1   0  -1  -1  -1  -1  -1  -1  -1  -1  -1   0   0
 -1  -1 312  -1  -1  -1 100  -1  -1 144  -1 307  33 166  -1  -1  -1  -1  -1  -1  -1  -1  -1   0
```

The step from compact matrix to binary model is univocal, but for the opposite step, it is not; that is to say, different compact matrices can be obtained from a binary model matrix. The binary matrix is introduced as a step that facilitates the description of the invention. It is possible to develop a compact matrix directly without going through the binary model matrix. In that case, for that compact matrix, its corresponding binary model matrix can be obtained which, if it is triple diagonal, will be in accord with the method of the invention.

The error correction codes can be "punctured," wherein the technique for puncturing consists in removing elements of the code word so that they will not be transmitted. In place of transmitting a code word $v=[v(0), v(1), \ldots, v(N-1)]$, a word $w=[w(0), w(1), \ldots, w(M-1)]$ will be transmitted, where $M<N$. The puncturing must be done in a controlled way, so that the necessary redundancy is transmitted in order for the decodifier of the receptor to be able to evaluate the transmitted data. This puncturing is applied to both the data bits and the parity bits. A pattern of puncturing can be defined as the sequence of bits that are to be transmitted as punctured, where said bit pattern can be periodic or aperiodic. In case there is no regularity, said pattern can be described with a vector pp of N positions, indicating with a "1" the bits to be transmitted and with a "0" the bits to be eliminated (punctured). Thanks to the puncturing technique, data communication can be amplified, since less redundancy is being sent. If the Hamming weight of the pattern pp is M, the total system rate of error codification is $R=K/M$.

For example, if we have a code with $R=5/6$ and block size $N=5184$ and we want to perform a puncturing in order to increase the rate to $R=16/18$, we can use the following puncturing pattern, which will yield a block with $N=4860$ bits:

$$pp_{5184}^{(16/18)} = [\underbrace{1\ 1\ \ldots\ 1}_{3240}\ \underbrace{0\ 0\ \ldots\ 0}_{162}\ \underbrace{1\ 1\ \ldots\ 1}_{972}\ \underbrace{0\ 0\ \ldots\ 0}_{162}\ \underbrace{1\ 1\ \ldots\ 1}_{648}]$$

In order to achieve implementation of LDPC codes, an electronic device is used, whether it be a program executed on a microprocessor or an FPGA or ASIC hardware implementation. Said device receives a block of data, calculates the parity bits, concatenates them with the information bits and submits them to the following phase of the transmitter to be adequately modulated and transmitted through the corresponding channel. The calculation of the parity bits may be done by means of the product of the generator matrix G or the solution of the system of equations presented previously.

The decodifier of LDPC codes is usually based on an iterative decodifier. A possible decodifier, among several state of the art options, consists of an estimator which, upon receiving the word corresponding to the transmitted code $r=v+z$, where Z is additive channel noise, makes a noise estimation $\hat{Z}$ such that $(r-\hat{Z})H^T=0$. In the case where the system makes use of the puncturing technique, before the decodifier there will be a unit that inserts an indicator in the punctured positions. This indicator serves to direct the decodifier to estimate the proper value in those positions.

FIG. 1 shows the block diagram of a typical codifier, where (1) is the data block to be transmitted u=[u(0), u(1), . . . , u(K−1)], (2) is a memory that contains the representation of the parity matrix H or the generator matrix G, (3) is said matrix, (4) is the block that performs the codification algorithm, (5) is the linear code word obtained from the codification v=[v(0), v(1), . . . , v(N−1)], (6) is the block that does the puncturing, and (7) is the word obtained after puncturing w=[w(0), w(1), . . . , w(M−1)].

Figure 2:
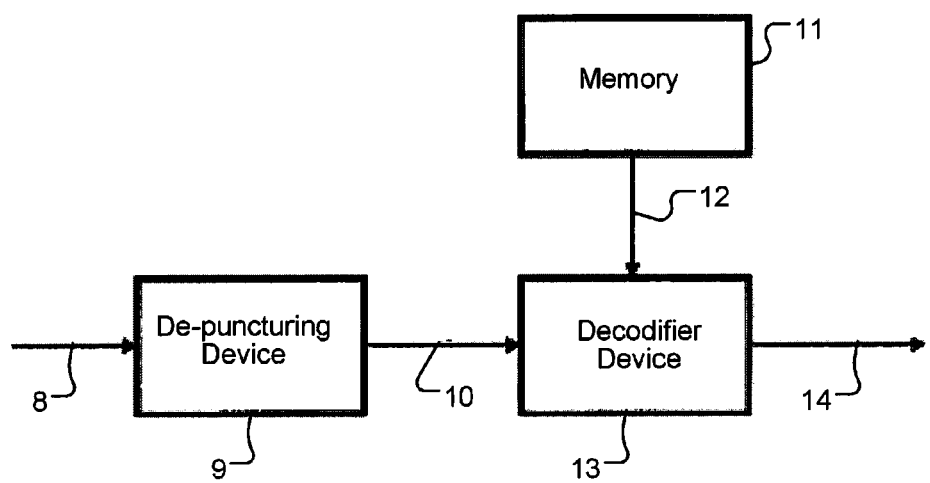
FIG. 2 is a block diagram of the decodifier in the transmitter.

FIG. 2 shows the block diagram for a decodifier, where (8) represents the received signal from the channel s=[$s_0$, $s_1$, . . . , $s_{M-1}$], which will be similar to the word obtained after puncturing but after being affected by the channel noise, (9) represents the block that performs the "de-puncturing," obtaining a word (10) r=[r(0), r(1), . . . , r(N−1)] with the number of bits in the LDPC code. (11) is the memory that contains either the parity matrix or the generator matrix in the receiver and transmits it (12) to the block that performs the decodifier algorithm (13). The output of this block will be the reconstituted data (14) û=[û(0), û(1), . . . , û(K−1)].

What is claimed is:

1. A method comprising:
    selecting a factor at a first device, wherein the factor is equal to a number of bits in a codeword divided by a natural number;
    generating a model matrix, wherein the model matrix includes (i) a first matrix comprising data, and (ii) a second matrix comprising parity bits, wherein Hamming weights of columns and rows of the model matrix are not constant and the Hamming weights of the columns correspond to a codification rate of a channel such that the model matrix is irregular;
    generating a compact matrix by replacing (i) each element of the model matrix that is equal to 1 with a pseudo-random positive whole number, and (ii) each element of the model matrix that is equal to 0 with a −1, wherein the pseudo-random positive whole number is greater than or equal to 0 and less than the factor;
    generating a quasi-cyclic code including a parity matrix by replacing (i) each positive element of the compact matrix with an identity matrix, and (ii) each element of the compact matrix equal to −1 with a null matrix, wherein each of the identity matrices is rotated cyclically a number of times indicated by a corresponding one of the positive elements of the compact matrix, wherein a number of rows in each of the identity matrices and each of the null matrices is equal to the factor, and wherein a number of columns in each of the identity matrices and each of the null matrices is equal to the factor;
    applying the quasi-cyclic code to a word of the data via a codification device to generate the codeword; and
    transmitting the codeword on the channel from the first device to a second device.

2. The method of claim 1, wherein:
    a number of rows in the parity matrix is equal to a number of bits in the quasi-cyclic code minus a number of bits in the word of the data; and
    a number of columns in the parity matrix is equal to the number of bits in the quasi-cyclic code.

3. The method of claim 1, wherein:
    a first portion of the second matrix of the model matrix includes a column vector;
    a number of elements in the column vector is based on a difference between a first parameter and a second parameter;
    the first parameter is equal to a number of bits in the quasi-cyclic code divided by the factor; and
    the second parameter is equal to a number of bits in the word of the data divided by the factor.

4. The method of claim 3, wherein:
    a second portion of the second matrix of the model matrix comprises a triple diagonal structure;
    the triple diagonal structure includes (i) a first central diagonal, (ii) a second central diagonal, and (iii) a last row diagonal; and
    bits in the first central diagonal, the second central diagonal, and the last row diagonal are equal to 1 and each of a remainder of bits in the triple diagonal structure is equal to 0.

5. The method of claim 1, wherein:
    a portion of the second matrix of the model matrix comprises a triple diagonal structure;
    the triple diagonal structure includes (i) a first central diagonal, (ii) a second central diagonal, and (iii) a last row diagonal; and
    bits in the first central diagonal, the second central diagonal, and the last row diagonal are equal to 1 and each of a remainder of bits in the triple diagonal structure is equal to 0.

6. The method of claim 1, wherein:
    a first portion of the second matrix of the model matrix comprises a pseudo-random column vector having a Hamming weight greater than 2;
    a second portion of the second matrix of the model matrix comprises a double diagonal structure;
    the double diagonal structure includes (i) a first central diagonal, and (ii) a second central diagonal; and
    bits in the first central diagonal and the second central diagonal are equal to 1 and each of a remainder of bits in the double diagonal structure is equal to 0.

7. The method of claim 6, wherein the pseudo-random positive whole numbers that replace the elements of the model matrix that are equal to 1 are a same pseudo-random positive whole number.

8. The method of claim 1, wherein the pseudo-random positive whole numbers that replace the elements of the model matrix that are equal to 1 are different pseudo-random positive whole numbers.

9. The method of claim 1, wherein:
    the quasi-cyclic code is a low density parity check code; and
    the codification rate is equal to a number of bits in the word of the data divided by a number of bits in the quasi-cyclic code.

10. The method of claim 1, wherein a transpose of the quasi-cyclic code multiplied by the codeword is equal to 0.

11. The method of claim 1, wherein:
    a transpose of the quasi-cyclic code multiplied by a binary matrix is equal to 0;
    a number of rows in the binary matrix is equal to a number of bits in the word of the data; and
    a number of columns in the binary matrix is equal to a number of bits in the codeword.

12. The method of claim 1, wherein the model matrix comprises:

```
1 0 1 0 0 1 0 1 0 0 0 0 0 1 0 0 0 0 0 0 0 0 0 0
1 0 0 0 1 0 0 0 1 0 1 1 0 1 1 0 0 0 0 0 0 0 0 0
0 1 0 0 0 0 1 0 1 0 1 1 0 0 1 1 0 0 0 0 0 0 0 0
0 0 1 0 0 1 0 1 0 1 0 0 1 0 0 1 1 0 0 0 0 0 0 0
0 0 1 1 1 1 0 0 0 0 0 0 0 0 0 1 1 0 0 0 0 0 0 0
0 1 0 0 0 0 0 1 0 1 1 0 0 0 0 0 1 1 0 0 0 0 0 0
0 0 1 1 0 1 1 0 0 0 0 0 0 0 0 0 0 1 1 0 0 0 0 0
1 0 1 0 1 1 0 0 0 0 0 0 0 0 0 0 0 0 1 1 0 0 0 0
0 1 0 0 0 0 0 0 1 1 1 1 0 0 0 0 0 0 0 1 1 0 0 0
0 0 0 1 0 0 0 0 1 0 1 1 0 0 0 0 0 0 0 0 1 1 0 0
0 0 1 0 0 1 1 1 0 0 0 0 1 0 0 0 0 0 0 0 0 0 1 1.
```

13. The method of claim 1, wherein the compact matrix comprises:

```
13 -1  7 -1 -1  1 -1  1 -1 -1 -1 -1 -1  0 -1 -1 -1 -1 -1 -1 -1 -1 -1
 5 -1 -1 -1 11 -1 -1 -1  4 -1  4  6 -1  0  0 -1 -1 -1 -1 -1 -1 -1 -1
-1 13 -1 -1 -1 -1 11 -1 10 -1  9 13 -1 -1  0  0 -1 -1 -1 -1 -1 -1 -1
-1 -1 13 -1 -1  6 -1 10 -1  5 -1 -1  4 -1 -1  0  0 -1 -1 -1 -1 -1 -1
-1 -1  8  8  2 11 -1 -1 -1 -1 -1 -1 -1 -1  0  0 -1 -1 -1 -1 -1 -1 -1
-1  3 -1 -1 -1 -1 -1 -1  1 -1  4  1 -1 -1 -1 -1  0  0 -1 -1 -1 -1 -1
-1 -1  4  2 -1  2  9 -1 -1 -1 -1 -1 -1 -1 -1 -1  0  0 -1 -1 -1 -1 -1
 2 -1 13 -1  4  9 -1 -1 -1 -1 -1 -1 -1 -1 -1 -1 -1  0  0 -1 -1 -1 -1
-1 11 -1 -1 -1 -1 -1 -1  6  4 11 12 -1 -1 -1 -1 -1 -1  0  0 -1 -1 -1
-1 -1 -1 10 -1 -1 -1 -1  1 -1 13 13 -1 -1 -1 -1 -1 -1 -1  0  0 -1 -1
-1 -1  0 -1 -1  0  2  2 -1 -1 -1  0 -1 -1 -1 -1 -1 -1 -1 -1  0  0 -1
-1 -1 -1 -1 -1 -1 -1 -1  1  2 11  2  4 12 -1 -1 -1 -1 -1 -1 -1 -1  0.
```

14. The method of claim 1, wherein the compact matrix comprises:

```
-1 -1 -1  6 -1 -1  9  6 -1 -1  2 -1 -1  0 -1 -1 -1 -1 -1 -1 -1 -1 -1
-1  0 -1 -1 -1  3 -1 12  1 -1 -1  3 -1  0  0 -1 -1 -1 -1 -1 -1 -1 -1
-1  9 11 -1 -1 13 -1 -1  2 12 -1 -1 -1  0  0 -1 -1 -1 -1 -1 -1 -1 -1
 1 -1 -1 11 -1 -1  7 -1 -1 -1 11 -1 -1 -1  0  0 -1 -1 -1 -1 -1 -1 -1
-1 -1 -1  4  8 -1 -1 -1 -1  2  5  4 -1 -1 -1  0  0 -1 -1 -1 -1 -1 -1
-1  3  0 -1 -1  8 -1 -1  1 -1 -1 -1 -1 -1 -1 -1  0  0 -1 -1 -1 -1 -1
-1 -1 -1  0  6 -1 -1 -1 -1  5 13 -1 -1 -1 -1 -1 -1  0  0 -1 -1 -1 -1
-1 -1 -1  9  1 -1 -1  3 -1 -1  3  1 -1 -1 -1 -1 -1 -1  0  0 -1 -1 -1
 9  0 13 -1 -1 12 -1 -1  8 -1 -1 -1 -1 -1 -1 -1 -1 -1 -1  0  0 -1 -1
-1  5 -1 -1  1  4 -1 -1  5 -1 -1 -1 -1 -1 -1 -1 -1 -1 -1 -1  0  0 -1
-1 -1 -1  8 -1 -1  8 -1 -1  9  0 -1  0 -1 -1 -1 -1 -1 -1 -1 -1  0  0
10 11 -1 -1 -1  3 -1 -1  0 -1 -1 -1  4  8 -1 -1 -1 -1 -1 -1 -1 -1  0.
```

15. The method of claim 1, wherein the compact matrix comprises:

```
-1  52  -1  64  -1  -1  60  -1  -1  -1  -1   1  -1   0  -1  -1  -1  -1  -1  -1  -1  -1  -1  -1
10  -1  -1  -1  -1  79  -1  -1  79  -1  78  51  -1   0   0  -1  -1  -1  -1  -1  -1  -1  -1  -1
 9  -1  -1  -1  -1  -1  -1  75  29  72   8  -1  -1  -1   0   0  -1  -1  -1  -1  -1  -1  -1  -1
-1  52  16  63  -1  -1  65  -1  -1  -1  -1  40  -1  -1   0   0  -1  -1  -1  -1  -1  -1  -1  -1
-1  24  -1  -1  47   1  39  -1  -1  -1  -1  -1  -1  -1  -1   0   0  -1  -1  -1  -1  -1  -1  -1
52  -1  -1  -1  -1  -1  -1  -1  53  79  48  -1  -1  -1  -1  -1   0   0  -1  -1  -1  -1  -1  -1
-1   0  -1  -1  72  -1  67  57  -1  -1  -1  -1  -1  -1  -1  -1  -1   0   0  -1  -1  -1  -1  -1
-1   7  -1  -1  -1   2  50  -1  -1  -1  15  -1  -1  -1  -1  -1  -1  -1   0   0  -1  -1  -1  -1
15  -1  19  -1  -1  -1  -1  -1  75  51  43  -1  -1  -1  -1  -1  -1  -1  -1   0   0  -1  -1  -1
72  -1  -1  -1  38  -1  -1  -1  69  -1  62  -1  -1  -1  -1  -1  -1  -1  -1  -1   0   0  -1  -1
-1  19  -1  41  -1  -1   1  41  -1  -1  -1   0  -1  -1  -1  -1  -1  -1  -1  -1  -1   0   0  -1
41  -1  17  -1  -1  -1  -1  -1  15  -1  30  -1  40   6  -1  -1  -1  -1  -1  -1  -1  -1  -1   0.
```

16. The method of claim 1, wherein the compact matrix comprises:

```
27  -1  -1  -1  55  19  -1  30  -1  -1  -1  -1  -1   0  -1  -1  -1  -1  -1  -1  -1  -1  -1  -1
-1  -1   0  -1  -1  -1  70  -1  47  -1  62  -1  -1   0   0  -1  -1  -1  -1  -1  -1  -1  -1  -1
-1  -1  41  -1  -1  -1  44  -1  -1  59  60  25  -1  -1   0   0  -1  -1  -1  -1  -1  -1  -1  -1
16  77  -1  -1  -1   5  -1  48  -1  -1  -1  -1  -1  -1  -1   0   0  -1  -1  -1  -1  -1  -1  -1
-1  -1  -1  45  -1  27  -1  46  19  -1  -1  -1  -1  -1  -1  -1   0   0  -1  -1  -1  -1  -1  -1
-1  -1  63  -1  -1  -1  55  -1  -1  -1  48  26  10  -1  -1  -1  -1   0   0  -1  -1  -1  -1  -1
-1  -1  -1  42  -1  21  -1  58  -1  41  -1  -1  -1  -1  -1  -1  -1  -1   0   0  -1  -1  -1  -1
-1  -1  -1  -1  78   0  -1   7  52  -1  -1  -1  -1  -1  -1  -1  -1  -1  -1   0   0  -1  -1  -1
-1  29   9  -1  -1  -1  37  -1  -1  -1  35  21  -1  -1  -1  -1  -1  -1  -1  -1   0   0  -1  -1
-1  -1  22  72  -1  -1  47  -1  -1  -1   0  -1  -1  -1  -1  -1  -1  -1  -1  -1  -1   0   0  -1
35  -1  -1  -1  -1  13  -1  35  -1  70  -1  -1   0  -1  -1  -1  -1  -1  -1  -1  -1  -1   0   0
-1  46  28  -1  -1  -1  38  -1  -1  -1   8  -1  10  58  -1  -1  -1  -1  -1  -1  -1  -1  -1   0.
```

17. The method of claim 1, wherein the compact matrix comprises:

```
 -1   -1   -1   -1   -1   -1  297  106  328   -1   -1   99   -1    0   -1   -1   -1   -1   -1   -1   -1   -1   -1   -1
290    0  312   -1   32   -1  120   -1   -1   -1   -1   -1   -1    0    0   -1   -1   -1   -1   -1   -1   -1   -1   -1
183   57   -1   -1  187   68   -1   -1   -1   -1  260   -1   81   -1    0    0   -1   -1   -1   -1   -1   -1   -1   -1
 -1   -1   -1  323   -1   -1   -1  137  354   -1   -1  162   -1   -1    0    0   -1   -1   -1   -1   -1   -1   -1   -1
 -1   -1  228   -1   -1   -1   -1  224   -1  114   -1  245   -1   -1   -1    0    0   -1   -1   -1   -1   -1   -1   -1
113   98   -1   -1  120   23   -1   -1   -1   -1   -1   -1   -1   -1   -1   -1    0    0   -1   -1   -1   -1   -1   -1
 -1   -1   -1   -1   -1   -1   -1  138   -1  187   45   62   -1   -1   -1   -1   -1    0    0   -1   -1   -1   -1   -1
 -1   -1  142   -1   -1   -1  347   67   -1   -1   46   -1   -1   -1   -1   -1   -1   -1    0    0   -1   -1   -1   -1
328  265   -1   66  156   96   -1   -1   -1   -1   -1   -1   -1   -1   -1   -1   -1   -1   -1    0    0   -1   -1   -1
212  184   -1   -1  102   -1   -1   -1  120   -1   -1   -1   -1   -1   -1   -1   -1   -1   -1   -1    0   -1   -1   -1
 -1   -1   -1   -1   -1   -1   -1   80   15   -1  329  153    0   -1   -1   -1   -1   -1   -1   -1   -1   -1    0    0
207   70   -1    7  235   -1   -1   -1   -1   -1   -1   81  185   -1   -1   -1   -1   -1   -1   -1   -1   -1   -1    0.
```

18. The method of claim 1, wherein the compact matrix comprises:

```
-1   34  -1   95  -1  279  -1  -1  -1  -1 248  -1  -1   0 -1 -1 -1 -1 -1 -1 -1 -1 -1 -1
-1   -1   0  -1   0  -1  -1  -1  -1  -1 134 356 275  -1  0  0 -1 -1 -1 -1 -1 -1 -1 -1
51   -1  27  -1  -1  -1  -1  -1  22 152  -1  57  -1  -1  0  0 -1 -1 -1 -1 -1 -1 -1 -1
-1  124  -1 290  -1 281  15  -1  -1  -1  -1  -1  -1  -1  0  0 -1 -1 -1 -1 -1 -1 -1 -1
-1  340  -1  99 336  -1  -1   1  -1  -1  -1  -1  33  -1 -1 -1  0  0 -1 -1 -1 -1 -1 -1
163  -1  46  -1  -1  -1  -1  -1 306  -1  86  -1  -1  -1 -1 -1  0  0 -1 -1 -1 -1 -1 -1
-1  185  -1  24  -1  -1  -1  94   0  -1  -1  -1  -1  -1 -1 -1 -1 -1  0  0 -1 -1 -1 -1
-1  223  -1 225 325  -1  -1  -1  -1  -1 297  -1  -1  -1 -1 -1 -1 -1  0  0 -1 -1 -1 -1
46   -1 314  -1  -1  -1  59  -1  -1  67  -1 120  -1  -1 -1 -1 -1 -1 -1 -1  0  0 -1 -1
-1   -1 121  -1  -1  -1  -1 161  -1 303  -1 264  -1  -1 -1 -1 -1 -1 -1 -1  0  0 -1
-1  303  -1   8  -1 185  -1  -1 138  -1  -1  -1   0  -1 -1 -1 -1 -1 -1 -1 -1 -1  0  0
-1   -1 312  -1  -1  -1 100  -1  -1 144  -1 307  33 166 -1 -1 -1 -1 -1 -1 -1 -1 -1  0.
```

19. The method of claim 1, wherein the compact matrix comprises:

```
49  -1  -1  21  31  -1  57  -1  -1  19  -1  29   2  -1  19  -1  -1   0 -1 -1 -1 -1 -1 -1
-1   7  22  -1  -1  37  -1  32  10  -1  26  -1  -1  59  -1  48  -1   0  0 -1 -1 -1 -1 -1
53  -1  -1  20  50  -1  -1   3  16  -1  49  -1  -1  28  14  -1  -1  -1  0  0 -1 -1 -1 -1
-1  58  23  -1  -1  15  54  -1  -1   5  -1  18  49  -1  -1  13  -1  -1 -1  0  0 -1 -1 -1
55  -1  -1  58  -1   9  -1  26  57  -1  41  -1  31  -1  21  -1  -1  -1 -1 -1  0  0 -1 -1
-1  10  49  -1  59  -1   7  -1  -1  30  -1  18  -1  48  -1   7  59  -1 -1 -1 -1  0  0 -1
48  -1  -1  50  18  -1  -1  11  52  -1  59  -1  -1  37  -1  10   0  -1 -1 -1 -1 -1  0  0
-1  24  16  -1  -1   0  53  -1  -1  41  -1  38  51  -1  58  -1  59   8 -1 -1 -1 -1 -1  0.
```

20. The method of claim 1, wherein the compact matrix comprises:

```
78  -1  -1 167 237  -1   3  -1 266  -1  -1 102 153  -1  -1 212  -1   0 -1 -1 -1 -1 -1 -1
-1  83 189  -1  -1  68  -1 178  -1  90 205  -1  -1  13   4  -1  -1   0  0 -1 -1 -1 -1 -1
-1 226 147  -1  46  -1  -1  76  -1 116  -1 211  -1 112  -1 118  -1  -1  0  0 -1 -1 -1 -1
92  -1  -1 214  -1 236 241  -1 157  -1 143  -1 214  -1 207  -1  -1  -1 -1  0  0 -1 -1 -1
144 -1  -1 258 264  -1  53  -1 114  -1 172  -1  -1  82 262  -1  62  -1 -1 -1  0  0 -1 -1
-1 153 120  -1  -1 199  -1 126  -1  61  -1 183  15  -1  -1 134  -1  -1 -1 -1 -1  0  0 -1
-1 100  -1 141  -1  36  -1  17  -1 156  -1 124 162  -1  -1  57   0  -1 -1 -1 -1 -1  0  0
196 -1 187  -1  73  -1  80  -1 139  -1  57  -1  -1 236 267  -1  62  -1 -1 -1 -1 -1 -1  0.
```

21. The method of claim 1, wherein the compact matrix comprises:

```
-1  13  32  47  41  24  -1  25  22  40   1  31   8  15  20  15  42  30  13   3  -1   0 -1 -1
25  46  15  43  45  29  39  47  23  38  39  12  -1  21  -1  38  33   0   0  -1  39   0  0 -1
35  45  45  38  14  16   6  11  -1  18   7  41  35  17  32  45  41  -1  18  17   0  -1  0  0
 9  32   6  22  26  31   9   8  22  32  40   4  18  40  36  -1  -1  23  31  41  39  20 -1  0.
```

22. The method of claim 1, wherein the compact matrix comprises:

```
-1   47 146 203 184 112  -1 116 103 181   3 140  38  68  91  70 191 138  62  14  -1   0 -1 -1
117 203  67 194 206 133 174 212 104 171 176  56  -1  96  -1 167 149   4   1  -1 177   0  0 -1
153 206 198 173  55  72  28  53  -1  82  34 186 161  80 144 204 187  -1  84  77   0  -1  0  0
 44 147  27  83 118 130  41  38 100 146 183  19  85 180 163  -1  -1 106 140 185 177  94 -1  0.
```

23. The method of claim 1, further comprising puncturing the codeword to remove bits of the codeword prior to the codeword being transmitted from the first device.

24. The method of claim 23, wherein the puncturing includes the following puncturing pattern:

$$pp^{(16/18)}_{1152} = [\ \underbrace{1\ 1\ \ldots\ 1}_{720}\ \underbrace{0\ 0\ \ldots\ 0}_{36}\ \underbrace{1\ 1\ \ldots\ 1}_{360}\ \underbrace{0\ 0\ \ldots\ 0}_{36}\ ].$$

25. The method of claim 23, wherein the puncturing includes the following puncturing pattern:

$$pp^{(16/18)}_{5184} = [\ \underbrace{1\ 1\ \ldots\ 1}_{3240}\ \underbrace{0\ 0\ \ldots\ 0}_{162}\ \underbrace{1\ 1\ \ldots\ 1}_{972}\ \underbrace{0\ 0\ \ldots\ 0}_{162}\ \underbrace{1\ 1\ \ldots\ 1}_{648}\ ].$$

26. The method of claim 23, wherein the puncturing includes the following puncturing pattern:

$$pp^{(20/21)}_{1152} = [\ \underbrace{1\ 1\ \ldots\ 1}_{720}\ \underbrace{0\ 0\ \ldots\ 0}_{48}\ \underbrace{1\ 1\ \ldots\ 1}_{240}\ \underbrace{0\ 0\ \ldots\ 0}_{96}\ \underbrace{1\ 1\ \ldots\ 1}_{48}\ ].$$

27. The method of claim 23, wherein the puncturing includes the following puncturing pattern:

$$pp^{(20/21)}_{5184} = [\ \underbrace{0\ 0\ \ldots\ 0}_{216}\ \underbrace{1\ 1\ \ldots\ 1}_{4320}\ \underbrace{0\ 0\ \ldots\ 0}_{432}\ \underbrace{1\ 1\ \ldots\ 1}_{216}\ ].$$

* * * * *